(12) United States Patent  
Kleinwächter

(10) Patent No.: US 6,407,328 B2
(45) Date of Patent: Jun. 18, 2002

(54) PHOTOVOLTAIC DEVICE

(75) Inventor: Jürgen Kleinwächter, Lömach (DE)

(73) Assignee: PowerPulse Holding AG, Zug (CH)

( * ) Notice: Subject to any disclaimer, the term of this patent is extended or adjusted under 35 U.S.C. 154(b) by 0 days.

(21) Appl. No.: 09/776,399

(22) Filed: Feb. 2, 2001

Related U.S. Application Data

(63) Continuation of application No. PCT/DE99/02366, filed on Aug. 5, 1999.

(30) Foreign Application Priority Data

Aug. 5, 1998 (DE) .......................................... 198 35 304
May 20, 1999 (DE) .......................................... 199 23 196

(51) Int. Cl.$^7$ .................... H01L 31/0232; H01L 31/052
(52) U.S. Cl. .................... 136/246; 136/259; 136/256; 126/634; 126/638; 126/639; 126/646; 126/651; 126/652; 126/655; 126/678
(58) Field of Search .................... 136/246, 259, 136/256; 126/634, 638, 639, 646, 651, 652, 655, 678

(56) References Cited

U.S. PATENT DOCUMENTS

| 4,052,228 | A | | 10/1977 | Russel | |
|---|---|---|---|---|---|
| 4,135,537 | A | * | 1/1979 | Blieden et al. | 136/247 |
| 4,143,233 | A | | 3/1979 | Kapany et al. | |
| 4,146,407 | A | | 3/1979 | Litsenko et al. | |
| RE30,584 | E | | 4/1981 | Russell | |
| 4,339,627 | A | * | 7/1982 | Arnould | 136/259 |
| 5,269,851 | A | * | 12/1993 | Horne | 136/248 |
| 5,660,646 | A | | 8/1997 | Kataoka et al. | |
| 6,005,185 | A | * | 12/1999 | Tange | 136/289 |

FOREIGN PATENT DOCUMENTS

| DE | 3109284 A1 | * | 9/1982 |
|---|---|---|---|
| DE | 42 10 975 A1 | | 10/1993 |
| DE | 43 07 705 A1 | | 8/1994 |
| DE | 43 07 691 A1 | | 9/1994 |
| DE | 196 28 036 A1 | | 1/1997 |
| DE | 296 05 277 U1 | | 9/1997 |
| DE | 19756234 A1 | * | 7/1998 |
| DE | 197 53 380 A1 | | 6/1999 |
| DE | 19804685 A1 | * | 8/1999 |
| DE | 198 09 883 A | | 9/1999 |
| EP | 0 033 683 A | | 8/1981 |
| EP | 03 84 056 A1 | | 8/1990 |
| EP | 0 789 405 A | | 8/1997 |

OTHER PUBLICATIONS

Chappell, Terry I., White, Richard M.: Characteristics of a water absrober in front of a silicon solar cell. In: Applied Physics Letters, vol. 28, No. 8, Apr. 15, 1976, pp. 422,423.
Heinbockel, J.H., Roberts, A.S.: A Comparison Of GaAs And Si Hybrid Solar Power Systems. In: Solar Energy, vol. 19, Mar. 29, 1976, pp. 291–300.

* cited by examiner

Primary Examiner—Alan Diamond
(74) Attorney, Agent, or Firm—Henry M. Feiereisen

(57) ABSTRACT

A photovoltaic device for converting radiation energy into electric power, includes a front side exposed to radiation from a radiation source, a backside; and a cooling unit having a liquid medium, e.g. water, arranged between the front side and the radiation source. The liquid medium is surrounded by an envelope, and forms with the envelope a selective filter allowing passage of radiation useful for the photovoltaic effect and converting the longer wave radiation into hear which is immediately dissipated to substantially prevent heating of the photovoltaic module.

15 Claims, 3 Drawing Sheets

PHOTOVOLTAIC DEVICE

CROSS-REFERENCES TO RELATED APPLICATIONS

This application is a continuation of prior filed PCT International Application No. PCT/DE99/02366, filed Aug. 5, 1999.

This application claims the priorities of German Patent Application Serial No. 198 35 304.9, filed Aug. 5, 1998, and German Patent Application Serial No. 199 23 196.6, filed May 20, 1999, the subject matter of which are incorporated herein by reference.

BACKGROUND OF THE INVENTION

The present invention relates, in general, to photovoltaic devices, and more particularly to a photovoltaic device of a type having a front side exposed to a radiation from a radiation source and an opposite backside for converting radiation energy into electric energy.

Photovoltaic electric power generators are normally fixed and aligned to the direction of incident primary sunlight. Occasionally, the systems have also been equipped with a uniaxial or biaxial solar tracking unit, or sunlight concentrators have been used.

In particular when using light concentrators, there is the problem that the efficiency deteriorates at elevated temperatures of the photovoltaic device. The reason for that is the fact that the electrons, liberated by incident light photons, are partially thermally recombined so that the useful outer current flow of the photovoltaic module is reduced. The prior art attempted to solve this problem by providing on the backside of the photovoltaic modules, just like in electric components, heat-conducting sheets to improve the heat emission. In the event of higher temperatures, the photovoltaic modules are actively cooled by conducting a coolant across the backside of the modules. The processes for active as well as passive heat dissipation are, however, structurally complex and thus only rarely applied.

It would therefore be desirable and advantageous to provide an improved photovoltaic device obviating prior art shortcomings and exhibiting a higher efficiency.

SUMMARY OF THE INVENTION

According to one aspect, the present invention provides for a photovoltaic device for converting radiation energy into electric power which photovoltaic device includes a front side exposed to radiation from a radiation source, an opposite backside, and a cooling unit which includes a liquid medium arranged between the front side and the radiation source.

In order to prevent a reduction of radiation incident on the photovoltaic device, to date only cooling units have been proposed which are arranged on the backside of the photovoltaic device. The invention is based on the recognition that a cooling unit implemented with a liquid medium can also be arranged on the front side of the photovoltaic device. The liquid medium can hereby be so selected that the useful range of the solar spectrum for the photovoltaic effects is not, or only insignificantly, absorbed by the liquid medium, while the radiation energy in the regions which are of secondary importance for the photovoltaic effects are absorbed by the liquid medium. The liquid medium thus permits passage of radiation energy useful for photovoltaic effects and absorbs the remaining radiation energy.

It has been shown that liquids comprised substantially of water are particularly useful as liquid medium. Depending on the employed photovoltaic module, it is, however, also possible to use oils, alcohols or similar substances. These media can be further mixed with substances which optimize the filter characteristic in a solution or suspension.

A simple photovoltaic device can be realized by circulating the liquid medium between the front side and the radiation source as a result of differences in gravity between warm and cold portions. This configuration is known as thermosiphon and includes a process water reservoir having a lower region with a cold water outlet. From here, cold water flows into the lower region of the photovoltaic device and rises within the photovoltaic device to its upper end from where the water flows back again to the reservoir. As warm water enters the reservoir at a higher location, a temperature gradient forms in the water reservoir, with cold water at the bottom and warmer water in the upper zone. Heated water can be withdrawn directly from the reservoir. Preferred however is the disposition of a process water heat exchanger in the reservoir to heat cold process water to the desired process water temperature.

According to another feature of the present invention, the cooling unit may include a pump for circulating the liquid medium. This permits a flow of the liquid medium through the cooling unit to thereby continuously dissipate heat. The cooling unit may also include a thermostat for controlling the pump. This enables a combination of a sufficient cooling with an effective warm water recovery. The temperature adjusted at the thermostat and the pump output are determined by the required warm water temperature and the demanded cooling action.

Particularly good cooling actions can be realized when conducting the liquid medium directly across photovoltaic elements. The efficiency can be increased when conducting the liquid medium first across the backside and then across the front side of the photovoltaic device. The still cold medium is thereby heated on the backside of the device and absorbs further heat energy on the front side of the device. In this way, an effective cooling of the photovoltaic device is realized on the one hand, and a liquid medium at relatively high temperature is made available for further utilization. The efficiency can still further be increased by providing several cooling units arranged in parallel or serial relationship. Suitably, a further cooling unit is positioned at a distance to the front side. While this distanced cooling unit serves mainly as selective filter, a direct placement of the cooling unit on the photovoltaic modules allows at the same time filter effects and a cooling of the modules.

Particular filter characteristics can be realized with the selection of the cooling medium. According to another feature of the present invention, a selective radiation-transparent layer is disposed between the liquid medium and the radiation source. On the one hand, this selective radiation-transparent layer serves the conduction of the fluid, and, on the other hand, the combination of radiation-transparent layer and liquid medium produces a filter characteristic which is suited to the solar spectrum to be exploited for photovoltaic effects.

According to another feature of the present invention, the radiation-transparent layer may be coated in selected areas in radiation-transparent manner on the side facing the radiation source. The selection of different coating materials and processes, too, has an impact on the filter characteristic to attain an optimal characteristic filter curve in a positive manner.

Extensive series of tests have shown that a plate or a film of a fluoropolymer as radiation-transparent layer yields particularly good results. Especially, films of fluoropolymer are good for manufacture and useful for conduction of liquid coolant and as radiation filter. Good results have also been realized with acryl, polycarbonate and glass because these materials offer a high transparency in the incident spectrum and are mechanically stable as well as weather-resistant and waterproof. This can be implemented in a cost-efficient manner, for example, with double webbed acryl (PMMA) plates and double webbed polycarbonate plates.

According to another feature of the present invention, the radiation-transparent layer forms an envelope which surrounds the liquid medium. This envelope thus represents a closed component which is usable as filter and can easily be exchanged.

Persons skilled in the art will understand that the various configurations of a photovoltaic device according to the present invention are applicable for non-concentrated as well as for concentrated radiation.

BRIEF DESCRIPTION OF THE DRAWING

Other features and advantages of the present invention will be more readily apparent upon reading the following description of preferred exemplified embodiments of the invention with reference to the accompanying drawing, in which.

DETAILED DESCRIPTION OF PREFERRED EMBODIMENTS

Figure 1:
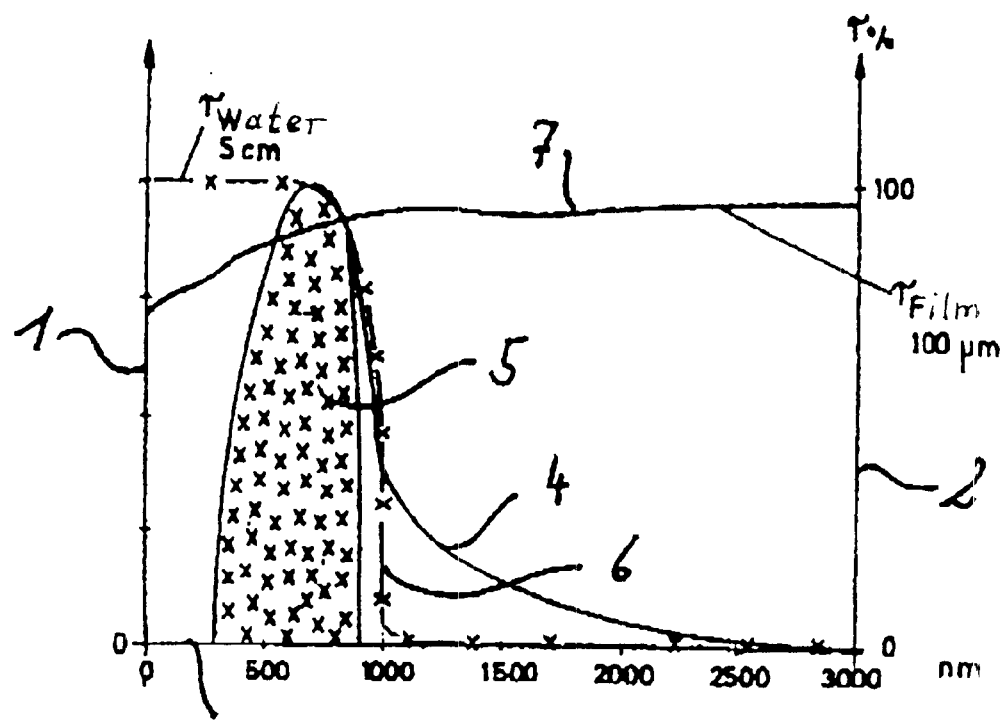
FIG. 1 is a graphical illustration showing a relation between a relative intensity of the solar spectrum and the wavelength, as well as a relation between a transparency of a water layer of a thickness of 5 cm and a fluoropolymer film of a thickness of 100 microns, on the one hand, and the wavelength, on the other hand.

Throughout all the Figures, same or corresponding elements are generally indicated by same reference numerals.

Turning now to the drawing, and in particular to FIG. 1, there is shown a graphical illustration showing a relation between a relative intensity of the solar spectrum and the wavelength, as well as a relation between a transparency of a water layer of a thickness of 5 cm and a fluoropolymer film of a thickness of 100 microns, on the one hand, and the wavelength, on the other hand. The relative intensity is plotted on the left ordinate, denoted by reference numeral 1, and the radiation transparency τ in percent is plotted on the right ordinate, denoted by reference numeral 2. The abscise, denoted by reference numeral 3, indicates the wavelength in nanometer. Plotted in this coordinate system are the solar spectrum 4 and an area 5 of the spectrum 4 that is useful for photovoltaic effects. The transmission of the 5 cm thick water layer is elucidated by curve 6, and curve 7 shows the transmission of the fluoropolymer film of a thickness of 100 microns.

The graphical illustration of FIG. 1 shows that the 5 cm thick water layer allows passage of almost the entire radiation of the spectral range useful for photovoltaic effects and absorbs only the longer wave radiation. The film allows almost unaltered passage of the radiation across the entire spectral region and absorbs a portion of the radiation only in the short-wave range. A photovoltaic module disposed beneath the water layer is thus exposed to nearly the entire radiation useful for photovoltaic effects whereas the longer wave radiation is absorbed by the water layer and leads to a heating of the water.

Figure 2:
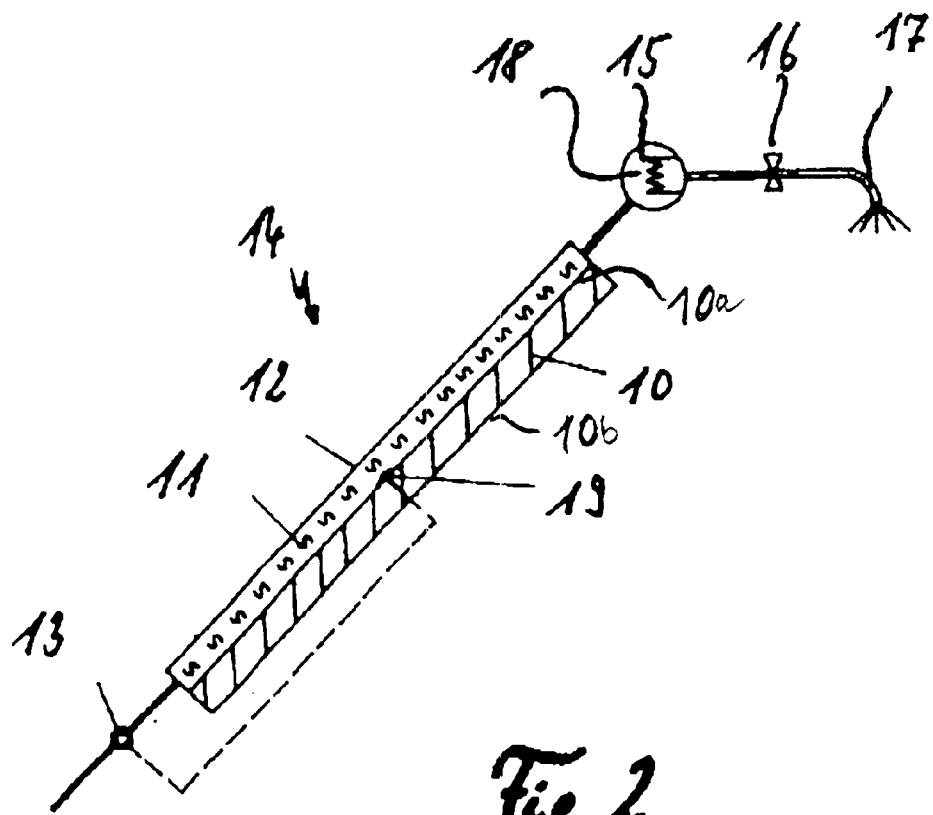
FIG. 2 is a schematic illustration of a single layer photovoltaic device according to the present invention.

Turning now to FIG. 2, there is shown a schematic illustration of a single layer photovoltaic device according to the present invention, generally designated by reference numeral 14, for exploitation of the afore-mentioned photovoltaic effect. The photovoltaic device 14 includes a photovoltaic module 10 having a front side 10a and a backside 10b. Flowing across the photovoltaic module 10 is a liquid medium, such as water layer 11, to cool the photovoltaic module 10. The water layer 11 is surrounded by an envelope, such as a transparent film 12, so that water is directed into this film 12. The envelope-forming film 12 may completely circumscribe the water layer 11 and thus rest on the radiation-exposed front side 10a. Alternatively, the envelope-forming film 12 may, however, only so embrace the water layer 11 that the water layer 11 remains in direct contact with the radiation-exposed front side 10a. The attachment of the film 12 can be implemented in various ways known to the artisan, so that a detailed description thereof is omitted for the sake of simplicity. Also, the general structure of a photovoltaic module is generally known by the skilled artisan and not described in detail for sake of simplicity.

A pump 13 pumps water from a reservoir (not shown) through the photovoltaic device 14 to a reservoir 15 from which water can be withdrawn from outlet 17 in controlled doses via a valve 16. A heating coil 18 is disposed in the reservoir 15 to effect an after-heating of the water, when the photovoltaic device 14 is insufficient to heat the water to a desired level.

The photovoltaic device 14 is further provided with a temperature probe 19 which controls the pump 13 in such a manner that heated fluid is pumped into the reservoir 15 and fresh, cool fluid flows into the arrangement, whenever the temperature probe 19 has reached a defined, adjustable limit temperature.

The water layer 11 within the envelope 12 defines a selective filter which permits passage of radiation of only certain wavelength. It is, however, also recuperative because it recovers recuperatively the heat flow occurring on the surface of the photovoltaic module 10 in essentially two ways. On the one hand, this is the heat exchange realized by the direct contact of the water layer 11 with the hot surface of the photovoltaic module 10. On the other hand, the surface of the photovoltaic module 10 radiates with a radiation shifted according to the Wien's displacement law in dependence on the temperature to the long wave range. This radiation is absorbed in accordance with the invention by the filter fluid, the water, and converted into heat.

For sake of simplicity, the description will refer to water only, but it will be understood by persons skilled in the art, that other liquid fluids such as oils, alcohols or similar substances generally follow the concepts outlined here and thus are considered to be covered by this disclosure. It is also possible to mix the liquid medium with suitable substances to optimize a filter characteristic in the solution or suspension.

Figures 3, 4:
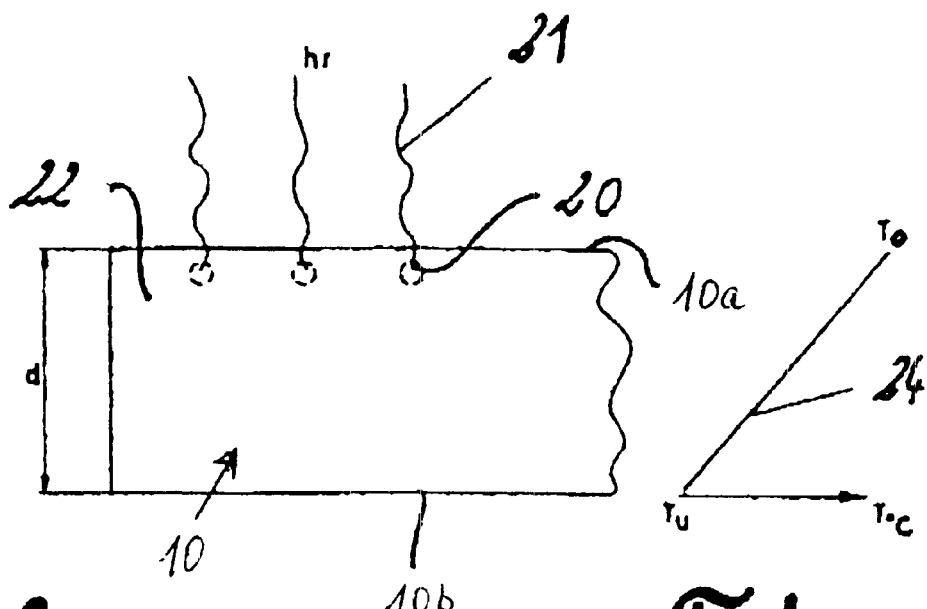
FIG. 3 is a cutaway view of a photovoltaic module of the photovoltaic device of FIG. 2.
FIG. 4 is a graphical illustration of a temperature distribution across a layer thickness of the photovoltaic module of FIG. 3.

In conventional photovoltaic devices, the long wave photons, which cannot trigger a photo effect, are absorbed in the module so that the generated heat flux must be withdrawn through the module. In contrast thereto, the cooling unit in accordance with the present invention converts the long wave photons into heat before they reach the photovoltaic module 10. As a consequence, in the photovoltaic device 14 according to the invention, the uppermost layer of the front side 10a, i.e. the side facing the radiation, is exposed to a particularly intense cooling action. This is relevant as will now be described with reference to FIG. 3, which shows a cutaway view of the photovoltaic module 10 of the photovoltaic device 14. As shown in FIG. 3, photons 20 of a radiation 21 emanating from a (not shown) radiation source, e.g. the sun, are absorbed in the uppermost layer 22 of the front side 10a of the photovoltaic module 10 which has a thickness d, thereby creating a temperature gradient between the front side 10a and the backside 10b. The linear temperature profile is shown in FIG. 4 by line 24, whereby $T_U$ represents the temperature at the backside 10b (or bottom side) of the photovoltaic module 10, and $T_O$ represents the temperature at the front side 10b (or top side) of the photovoltaic module 10. The graphical illustration of FIG. 4 clearly shows the advantageous cooling effect on the front side of the photovoltaic module 10 in accordance with the invention as the cooling action is applied directly on the hottest surface of the photovoltaic module 10.

Figure 5:
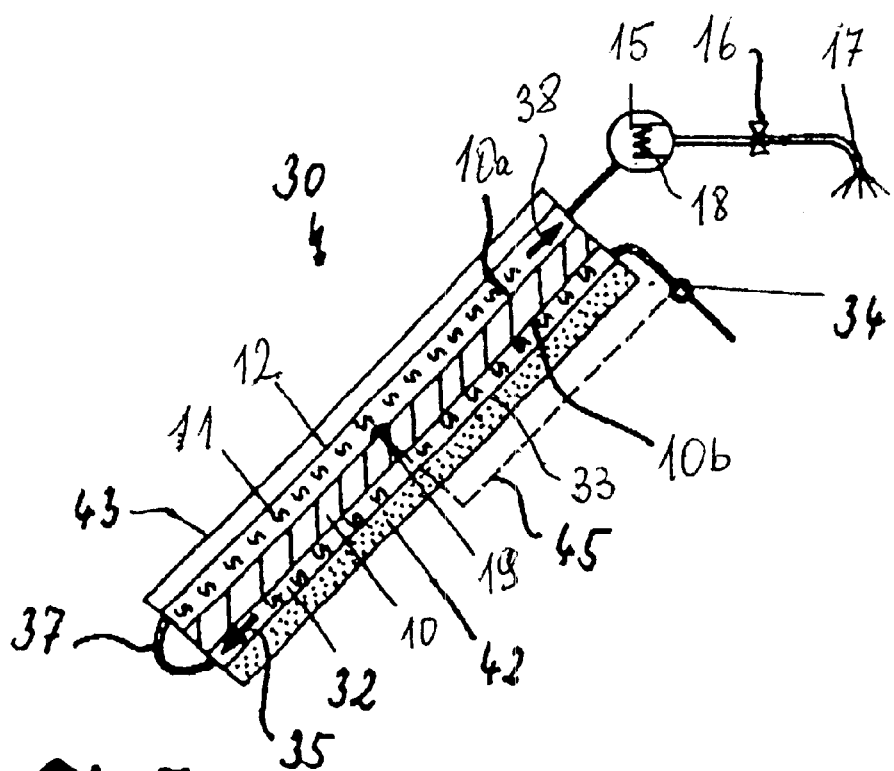
FIG. 5 is a schematic illustration of a double-layer photovoltaic device according to the present invention.

Turning now to FIG. 5, there is shown a schematic illustration of a double-layer photovoltaic device according to the present invention, generally designated by reference numeral 30 and including a photovoltaic module 10. Parts corresponding with those in FIG. 2 are denoted by identical reference numerals and not explained again. In addition to the fluid layer 11, which flows across the radiation-proximal front side 10a and is surrounded by the envelope 12, e.g. a transparent fluoropolymer film, the photovoltaic device 30 is provided with a further fluid layer 32, which flows across the radiation-distal backside 10b of the photovoltaic module 10 and is also surrounded by an envelope 33, e.g. a transparent fluoropolymer film. The fluid, e.g. water, is circulated by a pump 34 to flow first downwards along the backside 10b of the photovoltaic module 10 in a direction indicated by arrow 35 so as to cool the backside 10b. A deflection device 37 conducts the stream of fluid from the lower end of the photovoltaic module 10 around the module 10 to the upper front side 10a to then flow as fluid layer 11 along the front side 10a upwards in the direction of arrow 38, thereby further heating the fluid. The fluid then flows into the reservoir 15 from which the fluid can be withdrawn from outlet 17 in controlled doses via the valve 16.

The fluid-carrying layer 32 on the backside 10b may either be a coiled pipe of suitable geometry in good heat contact with the backside 10b, or a whole-area plate heat exchanger. To minimize heat losses to the outside, an opaque heat insulation 42 is placed around the fluid layer 32 on the backside 10b of the photovoltaic device 30, and a transparent covering 43 is placed around the fluid layer 11 at a distance to the transparent fluoropolymer film 12.

The exemplified photovoltaic device 30 of FIG. 5 also includes the temperature probe 19 for realizing a thermostat control 45 which permits a desired adjustment of the temperature increase of the cooling fluid. The temperature desired at outlet 17 depends on the application at hand, and may lie at 30° C., for example for a swimming pool heater, while shower water may require a temperature of about 40° C. Both these typical types of use of solar-heated warm water find application in areas of moderate climate, in particular during the summer half-year. As the mean photovoltaic module temperature during this season lies above 50° C., the system according to the invention provides not only for electric power and warm water but also increases at the same time the power efficiency.

In accordance with the present invention, a surface element which to date was able to generate electric power at only about 10% efficiency from the available radiation can now be used to make a photovoltaic module which generates current and warm water at an overall efficiency of about 60%.

Figure 6:
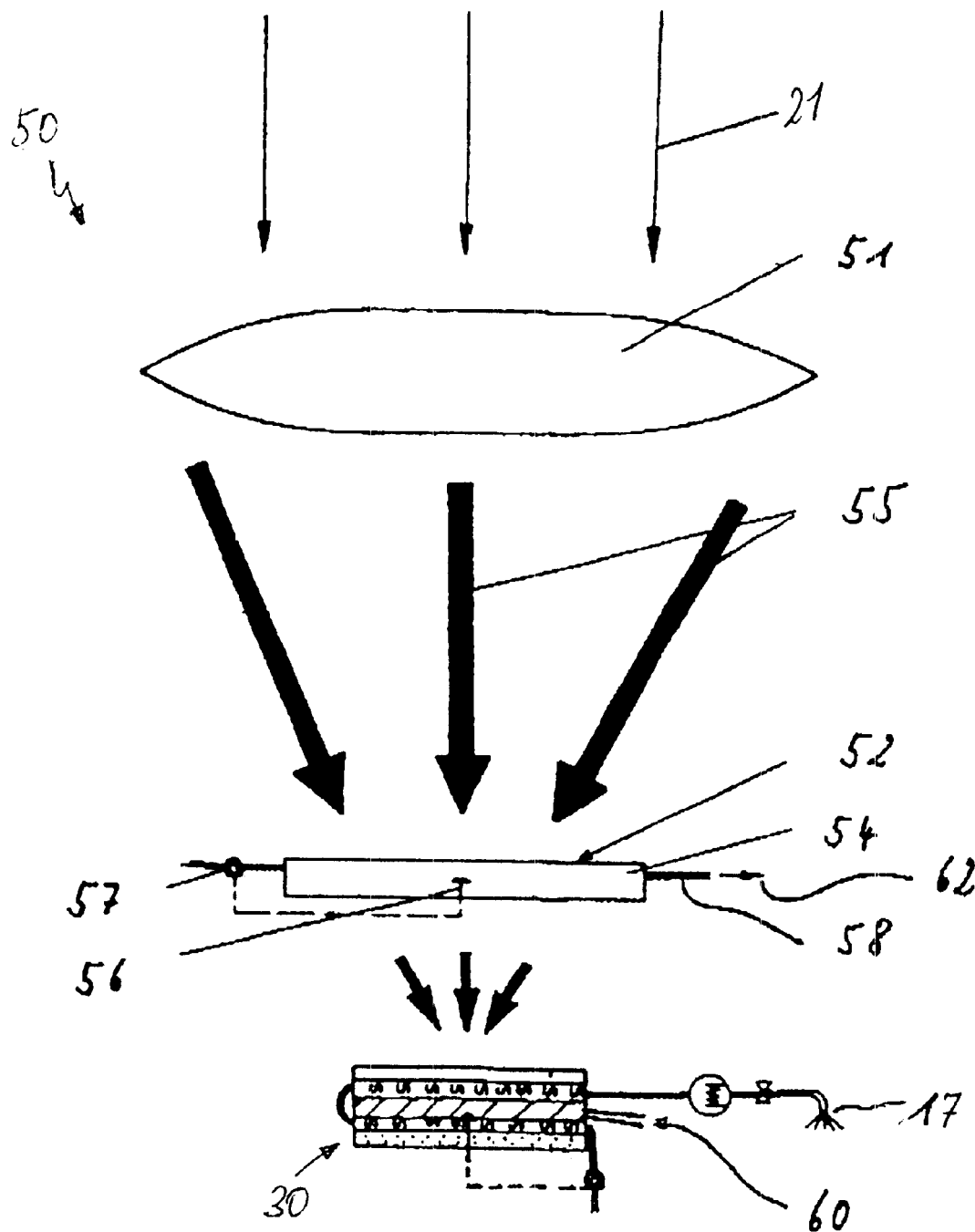
FIG. 6 is a schematic illustration of a double-layer photovoltaic device according to the present invention in combination with a concentrator and pre-cooler.

Turning now to FIG. 6, there is a schematic illustration of a photovoltaic arrangement, generally designated by reference numeral 50, including the double-layer photovoltaic device 30 of FIG. 5 for use with sunlight concentration. Especially in cases of increased energy density on the surface of the photovoltaic module 10, the afore-described, selective and recuperative heat extraction mechanisms have an even stronger impact. When using the photovoltaic device 30 for concentrated radiation, the energy content of the long wave, photovoltaically non-useful part of the solar spectrum is used to heat water to a relative low temperature. When the coolant stream is heated to higher temperatures, the efficiency of the photovoltaic module is decreased.

The photovoltaic device 30 is combined with a concentrator lens 51 and a pre-cooler 52. Of course, the concentrator lens 51 may be replaced by any other suitable concentrator optics, such as, for example, a mirror system. The pre-cooler 52 serves as pre-filter which includes in case of a linear concentrator a transparent cuboid of a dimension commensurate with the focal line at this location. In case of spot-like concentrator, a transparent flat hollow cylinder is used of a dimension commensurate with the focal sport at this location.

A fluid flows through the hollow cuboids or hollow cylinders and has besides the selectivity, illustrated in FIG. 1, a boiling point which is as high as possible so that the system pressure remains low. In the case at hand, water is used with respective additives. This water is heated in the hollow cuboid or hollow cylinder 54 by the radiation 55 concentrated by the lens 51 to temperatures in the range of about 100° C. When the predetermined temperature has been reached, a temperature probe 56 acts on a pump 57 so that a new fluid stream can be pumped into the cavity 54 of the hollow cuboid or hollow cylinder. As a consequence, very high temperatures are generated in the focal spot of the lens 51 and used for heating of a selectively radiation-transparent fluid.

The arrangement 50 is thus capable to produce electric power, tapped at 60, process water heat 61 and high-temperature process heat, tapped at 62, from primary incident energy of the radiation 21. The energy of the high-temperature heat may hereby be converted, for example via suitable thermodynamic machines, into mechanical work or additional electric power. The quantity of warm water produced at the photovoltaic devices 30 may, however, further be heated in the pre-filter 52 by connecting the outlet 17 to the pump 57.

The photovoltaic devices 14, 30 according to the present invention are based on a correct selection of the liquid medium and the transparent material for the envelope 12. There are many options that can be used as liquid medium, ranging from water via oils, alcohols etc. As photovoltaic modules of different configuration (e.g. silicon, GaAs, ZnS etc.) can be used, the selective filter must be matched to the respectively required photovoltaically active spectral region.

This matching is, optionally, realized in a relative precise manner through filter characteristic curves of the transparent enveloping materials and/or liquids. The filter properties can be varied by selectively coating the enveloping materials themselves and admixing additives to the liquids.

In the described exemplified applications, a commercially available fluoropolymer film of a thickness of 100 microns was used. This film is chemically inert, environmentally neutral and is flexible to process. Care should be taken, when using films, that a suitable mechanical support or channel-like subdivision of the water-carrying layer is used to prevent a pillow-shaped bulging in order to form a relatively even thickness of the water layer across the entire area.

Photovoltaic modules are normally covered on their surface with a glass sheet or plastic sheet in order to protect the active photovoltaic area against mechanical impacts. When using an envelope for conducting liquids, which may bear upon the active photovoltaic area, the use of a further covering of the photovoltaic modules may be omitted as the water conducting components assume the function of a protective surface. For example, so-called dual web plates can be used to guide the liquid upon the photovoltaic modules and to protect the photovoltaic modules at the same time. Of course, conventionally used glass plates may also be provided with liquid-pervious channels which extend in the plate plane, or may allow as double plate a liquid-guiding layer.

In the described exemplified embodiments, water was used as selective fluid. Water is cheap and environmentally neutral. When using additives for water, the use of a heat exchanger is required for generating process water. The temperature of the produced amount of warm water may, however, be so set that water without additives can be used. As a consequence, the use of a heat exchanger may be omitted.

While the invention has been illustrated and described as embodied in a photovoltaic device, it is not intended to be limited to the details shown since various modifications and structural changes may be made without departing in any way from the spirit of the present invention.

What is claimed as new and desired to be protected by Letters Patent is set forth in the appended claims:

1. A photovoltaic device comprising:
   a front side exposed to radiation from a radiation source;
   a backside for converting radiation energy into electric power;
   a cooling unit having a liquid medium arranged between the front side and the radiation source; and
   a layer between the liquid medium and the radiation source, wherein the layer is an element selected from the group consisting of fluoropolymer film and fluoropolymer plate.

2. The photovoltaic device of claim 1, wherein the liquid medium is substantially water.

3. The photovoltaic device of claim 1, wherein the liquid medium flows between the front side and the radiation source as a result of gravity differentials between warm and cold portions of the liquid medium.

4. The photovoltaic device of claim 1, wherein the cooling unit includes a pump for transporting the liquid medium.

5. The photovoltaic device of claim 4, wherein the cooling unit includes a thermostat for controlling the pump.

6. The photovoltaic device of claim 1, wherein the liquid medium flows across the backside before flowing across the front side.

7. The photovoltaic device of claim 1, and further comprising a further one of said cooling unit, said further cooling unit disposed at a distance to the front side.

8. The photovoltaic device of claim 1, wherein the layer has selected areas which are radiation-transparent.

9. The photovoltaic device of claim 1, wherein the layer forms an envelope surrounding the liquid medium.

10. A photovoltaic device comprising:
    a radiation-proximal side exposed to radiation from a radiation source;
    a radiation-distal side for converting radiation energy into electric power;
    a cooling unit having a liquid medium arranged between the radiation-proximal side and the radiation source, said cooling unit including a pump for transporting the liquid medium and a thermostat for controlling the pump; and
    a radiation-transparent layer disposed between the liquid medium and the radiation source and including an element selected from the group consisting of fluoropolymer film and fluoropolymer plate, said layer forming an envelope surrounding the liquid medium and resting on a surface of the radiation-proximal side.

11. The photovoltaic device of claim 10, wherein the liquid medium is substantially water.

12. The photovoltaic device of claim 10, wherein the liquid medium flows across the radiation-distal side before-flowing across the radiation-proximal side.

13. The photovoltaic device of claim 10, and further comprising a further one of said cooling unit disposed at a distance to the radiation-proximal side.

14. The photovoltaic device of claim 10, and further comprising a coating applied on the radiation-transparent layer on a side facing the radiation source.

15. The photovoltaic device of claim 14, wherein the coating has selected areas which are radiation-transparent.

* * * * *